United States Patent [19]

Schwartz et al.

[11] Patent Number: 4,549,289

[45] Date of Patent: Oct. 22, 1985

[54] METHOD FOR CORRECTING ACOUSTIC DISTORTION

[76] Inventors: Jack Schwartz; Tai T. Wu, both of 147 Ridge St., Arlington, Mass. 02174

[21] Appl. No.: 505,837

[22] Filed: Jun. 20, 1983

[51] Int. Cl.[4] ..................... G11B 27/36; G10K 11/00
[52] U.S. Cl. ......................................... 369/53; 381/71
[58] Field of Search ..................... 369/53; 381/71, 94, 381/56; 360/31

[56] References Cited

U.S. PATENT DOCUMENTS 4,417,098 11/1983 Chaplin ................................. 381/94
4,490,841 12/1984 Chaplin ................................. 381/71

FOREIGN PATENT DOCUMENTS 2088951 6/1982 United Kingdom ................. 381/71

Primary Examiner—Alan Faber
Attorney, Agent, or Firm—Robert F. Van Epps

[57] ABSTRACT

A method and apparatus useful in both the recording and playback of audio recordings for correcting the effects of acoustic distortion introduced by the room in which the recording is made and/or played. An acoustic test impulse is generated and the response observed to establish the acoustic properties of the room. The response is sampled and used to generate an equalizing function which may be stored and convoluted with the audio signals being recorded or played to substantially eliminate the distortion. In an alternative embodiment the corrected signals may be further convoluted with a function representing the acoustic properties of a different room environment.

12 Claims, 13 Drawing Figures

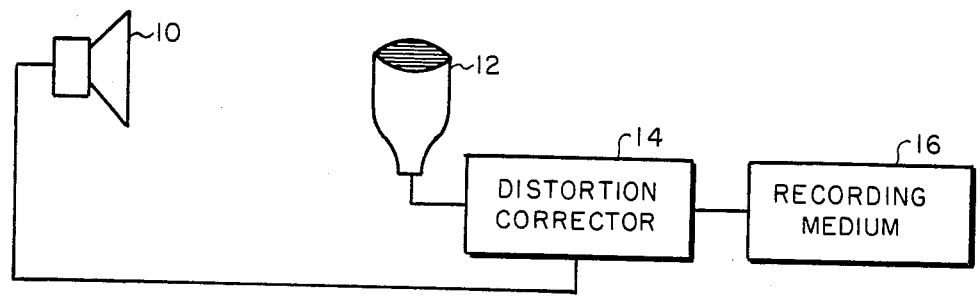
FIG. I
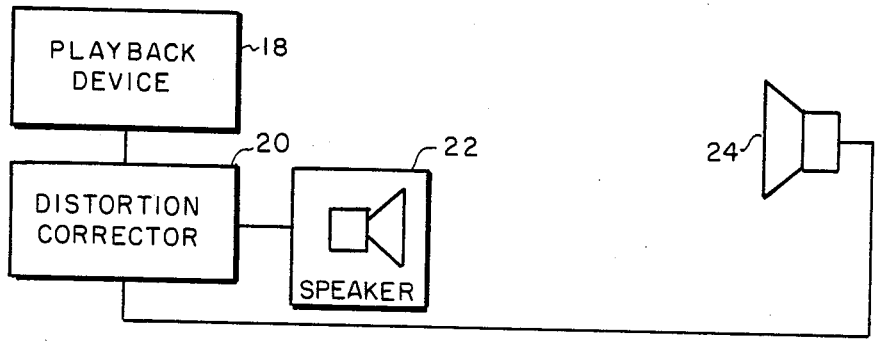
FIG. 2
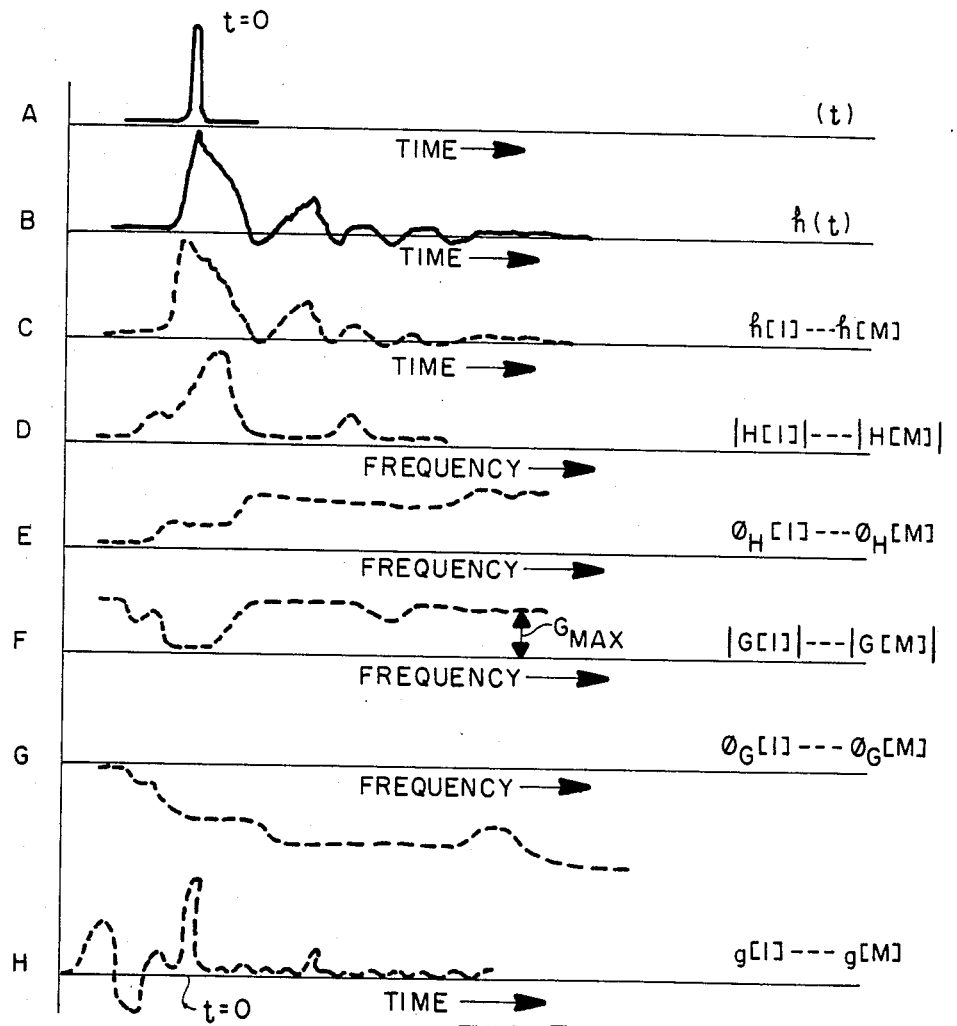
FIG. 3

METHOD FOR CORRECTING ACOUSTIC DISTORTION

BACKGROUND OF THE INVENTION

1. Field of the Invention

The present invention relates generally to the field of sound systems and more particularly to a method and apparatus for correcting acoustic distortions in the recording or playback of audio material introduced by the room environment in which the recording is made and/or played, as well as in the associated transducer and electronic systems.

2. Description of the Prior Art

Prior to the present invention it has been well known that the acoustic properties of a room have an effect upon sound both during recording and during playback of a recording. Each room will exhibit unique combinations of properties depending upon the size, shape, finishing materials and contents of the room. This is evidenced by the capacity of some trained musicians to identify the location at which a recording was made simply by listening to the recording. Additional distortion is introduced by the non-uniform frequency response of microphones, loudspeakers and associated components, any of which may impart a coloration to the reproduced sound as perceived by a listener.

In the recording studio elaborate steps are taken to minimize the acoustic effects of the room environment. The ultimate such step would be to perform the recording in an anechoic chamber, however, such extreme would be prohibitive in cost and would sound unnatural due to the lack of any reverberations. For the listener of sound recordings little has been done to correct the acoustic distortion introduced by the room environment in which the recording is played. Some benefit is gained through the use of presently available graphic equalizers which typically provide one gain control per octave per stereo channel. Even a cursory analysis of the potential resonances in a typical sized room reveals thousands which are closely spaced throughout the audio spectrum. To balance these resonances individually with a graphic equalizer would require a corresponding number of gain controls which would become impossible of operation.

OBJECTIVES AND SUMMARY OF THE INVENTION

From the preceding discussion it will be understood that among the vairous objectives of the present invention are included the following:

the provision of a method and apparatus for correcting the effects of acoustic distortions introduced by the room environment;

the provision of a method and apparatus of the above-described character which is useful in both the recording and playback of audio recordings;

the provision of a method and apparatus of the above-described character for simulating the acoustic properties of a different room environment.

These and other objectives of the present invention are efficiently achieved by introducing an acoustic test impulse into the room environment and sampling the response. The values of the sampled response are used to generate an equalizing function which is stored and convoluted with the audio signals being recorded or played to thereby substantially eliminate the room-induced acoustic distortion. The corrected output equalized for the room response may be further convoluted with a function representing the acoustic properties of a different and more desirable room.

The foregoing as well as other objectives, features and advantages of the present invention will become better understood from the following detailed description considered in conjunction with the various views of the appended drawings.

BRIEF DESCRIPTION OF THE DRAWINGS

FIG. 1 is a simplified illustration of the use of the present invention in audio recording;

FIG. 2 is a simplified illustration of the use of the present invention in an audio playback system;

FIGS. 3 A-H illustrate the acoustic response in amplitude as a function of time of a typical room and the functions thereof upon which operation of the present invention is based;

DESCRIPTION OF PREFERRED EMBODIMENT

Figure 4:
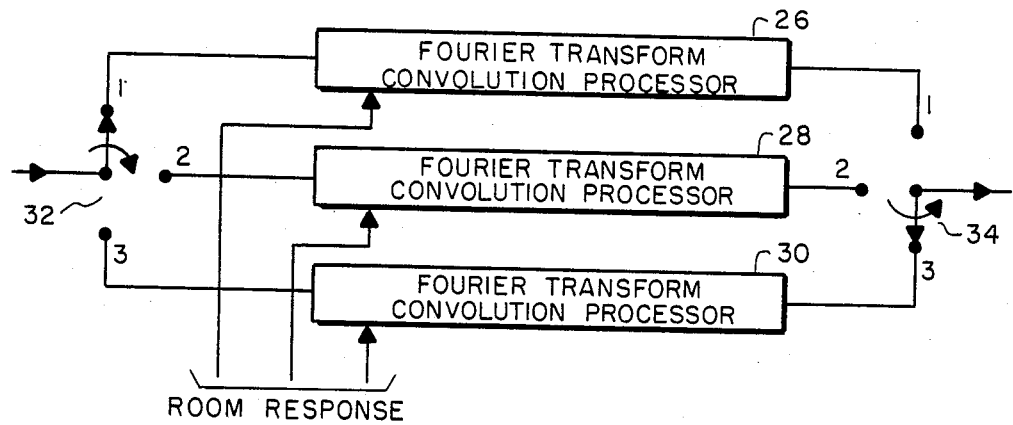
FIG. 4 is a simplified diagram of an embodiment of the present invention using a plurality of Fourier transform convolution processors.

Turning now to FIG. 1 there is shown a schematic representation of the present invention as it would be configured for use in making a recording. An acoustic impulse generator 10 is placed in the position to be occupied by a performer relative to a microphone 12. One or more acoustic test pulses are emitted into the room and the response is detected by microphone 12 and coupled to a distortion corrector 14 to be described hereinbelow. Based upon the character of the original test pulse and the response, which includes the effects of the room distortion, as well as microphone and electronic distortion, the distortion corrector 14 generates a set of correction values. These correction values are effectively the inverse of the room distortion and, when convoluted with the signals representing the sound being recorded, operate to substantially eliminate that distortion before storage on the recording medium 16. The corrected program signals may be further convoluted with another set of values representing the acoustic properties of another more desirable room. For example, a recording made in a sound studio could be made to sound as though it had been made in a particular concert hall.

FIG. 2 is a schematic representation of the present invention as used to correct the output of a sound system for the distortion introduced by the room in which a recording is to be played. The output of a playback device 18 is coupled through the distortion corrector 20 to the speaker 22. The distortion corrector causes the speaker to emit one or more acoustic test pulses into the room. The response is detected by a test sensor 24 placed in the position to be occupied by the listener relative to the speaker 22. The output of test sensor 24 is coupled to the distortion corrector 20 which operates as above to correct the output of playback device 18 such that room-induced distortion is substantially eliminated.

FIG. 3 is a graphic representation of the effects of acoustic distortion introduced by the room in which a recording is made or played. FIG. 3A is a sharp test impulse $\delta(t)$ emitted into the room. FIG. 3B shows the amplitude of the room response $\underline{h}(t)$ as a function of time and illustrates the effect of distortion introduced by room resonances. FIG. 3C illustrates the room response h(t), after sampling at a preselected time increment, $\tau_s$. For example, a sampling rate of $2.5 \times 10^{-5}$ sec. allows a frequency response of up to 20,000 Hz. FIG. 3D represents the magnitude of the M point Fourier transform of h(t) into the frequency domain $|H[1]| \ldots |H[M]|$ as a function of frequency. FIG. 3E illustrates the phase $\phi_H[1] \ldots \phi_H[M]$ of the Fourier transform of h(t) also a function of frequency. FIG. 3F shows the magnitude of the equalizing function $|G[1]| \ldots |G[M]|$ which is the reciprocal of the magnitude of the corresponding transform $H[1] \ldots H[M]$. FIG. 3G represents the phase of the equalizing function, $\phi_G[1] \ldots \phi_G[M]$, which is the negative of the corresponding phase elements $\phi_H[1] \ldots \phi_H[M]$. Finally FIG. 3H shows the M point inverse Fourier transform $g[1] \ldots g[M]$ of the equalizing function from the frequency to the time domain. It will be noted that the function of FIG. 3F bears little resemblence to the functions from which it is derived and has significant values at negative time values which can be physically realized to an approximation only because of the time delay; i.e. negative time values up to the delay time introduced by the distortion corrector may be used. This is a relatively common condition in finite impulse response (FIR) digital filters known in the art.

It should be noted that a number of impulse test signals may be averaged before calculating the equalizing function to reduce the effects of noise.

As noted above the room response signal h(t) is coupled to the distortion corrector which, as shown in FIG. 4, may comprise a plurality of Fourier transform convolution processors 26, 28 and 30 respectively. Signals representing the program material to be recorded or played are sampled at the same rate, $\tau_s$, as the test impulse and sequentially applied via switch 32 to the individual processors. The processor output is sequentially coupled via switch 34. Each Fourier transform convolution type processor operates on the input in batches. Thus, a batch of M sampled values is applied to processor 26 after which switch 32 cycles to the input of processor 28 and then to processor 30. As the input is being applied to processor 26 the corrected output signals are released from processor 30 and processor 28 operates on its input. If one choses a set of 10,000 stored values as constituting a batch (i.e. M=10,000) then the cycle time for each processor would be 0.25 sec. The output signal is thus delayed by a time, $2\tau$ where $\tau$, equals the number of samples, M, times the sampling rate, $\tau_s$. It will be noted that switch 34 is cycled at two positions behind switch 32 such that batches of corrected signals are released in the same sequence as the uncorrected signals are received.

Figure 5:
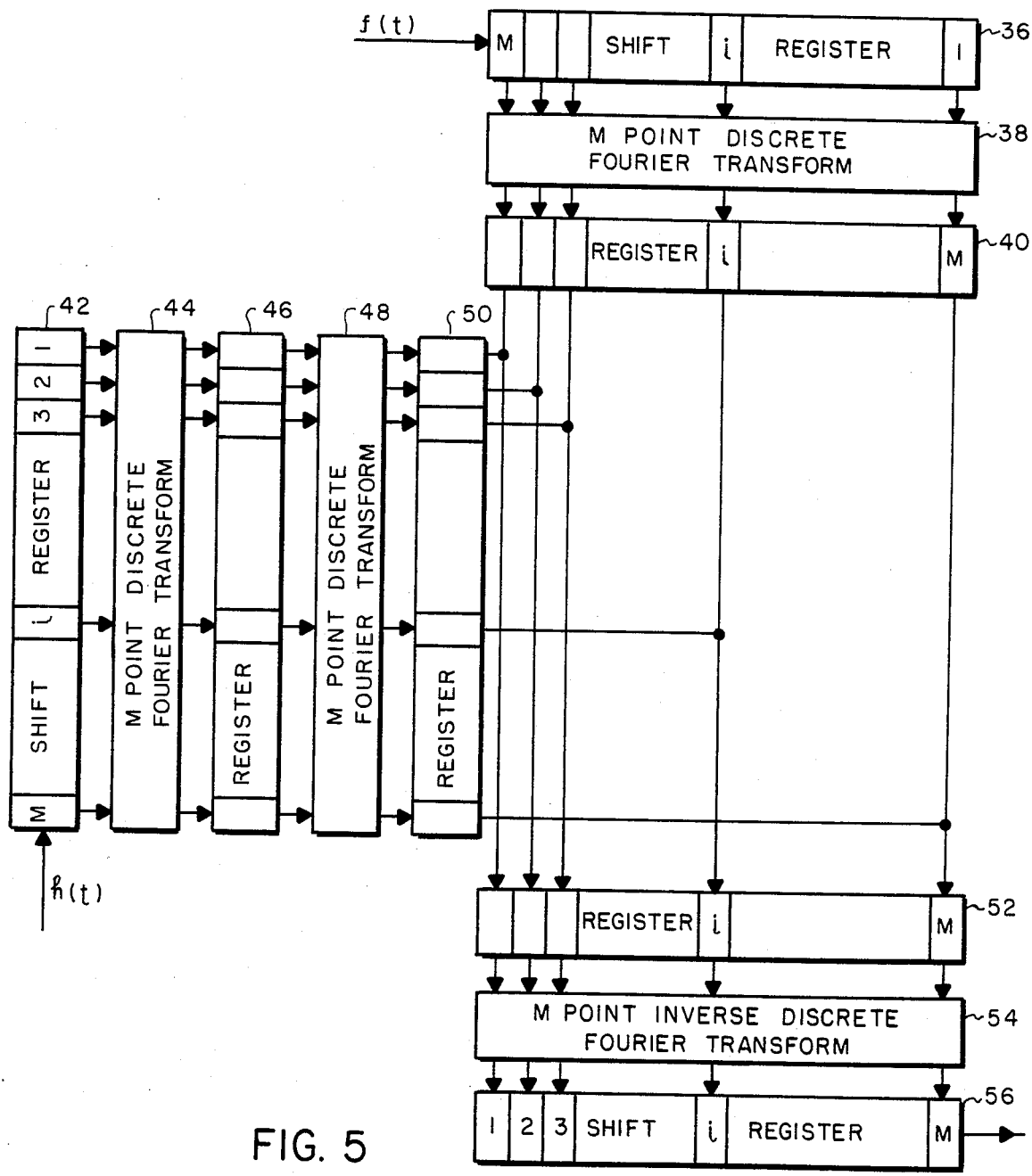
FIG. 5 is a block diagram of a Fourier transform convolution processor useful in the embodiment of FIG. 4.

FIG. 5 illustrates in more detail the Fourier transform convolution processor of FIG. 4. The uncorrected input signal, f(t) is applied to a shift register 36 until it is filled with M discrete samples during the input cycle, $\tau$. The most recent or last value of f(t) is stored at location M−1 of the shift register and is represented as $f(t-\tau_s)$, location M−2 as $f(t-2\tau_s)$, location i as $f(t-(M-i)\tau_s)$ and so on to the oldest value at location 1 as $f(t-M\tau_s)$. A discrete Fourier transform, $f(t) \to F(\omega)$, from the time to the frequency domain, is applied at 38 to the individual samples to produce an output consisting of complex numbers which are stored in register 40 in an increasing order of frequency, $F(\omega_1), F(\omega_2) \ldots F(\omega_i) \ldots (F\omega_M)$ where $\omega_M = 2\pi/\tau_s$.

The sampled values, $h[1], h[2], \ldots h[i] \ldots h[M]$ of the room response, h(t), are likewise stored in register 42. An M point Fourier transform, $h(t) \simeq H(\omega)$ is applied at 44 to transform the samples from the time to the frequency domain and, again the values are stored in register 46 in increasing order of frequency. The complex reciprocal $G(\omega) \simeq 1/H(\omega)$ of each sample is taken at 48 and stored in register 50. It should be noted that operation on the input signal f(t) by the processor is continuous while the operation on the room response signal h(t) is performed once for given room conditions and then processed to obtain $G(\omega)$ values which are maintained essentially constant, and the same in each processor. Because the quantities $F(\omega)$ and $G(\omega)$ are complex numbers, each actually is a pair of numbers either in magnitude-phase or real-imaginary form depending upon the Fourier transform algorithm used.

Each sample of the input signal in the frequency domain $F(\omega_1) \ldots$ is then multiplied by its corresponding sample of the complex reciprocal of the room response $G(\omega_1) \ldots$ which may be viewed as a value of gain and phase shift for the Fourier component of the signal at that frequency. The results of the multiplication, $R(\omega_1) \ldots$, stored in register 52. An M point inverse discrete Fourier transform is then applied at 54 to reconvert the samples to the time domain $r(t-\tau_s) \ldots$ and the results stored in shift register 56 ready for release as described in connection with FIG. 4.

The output of the several processors is thus a stream of corrected values forming an output signal r(t) which, in practical effect corresponds to the input signal f(t), delayed by a time, $2\tau$, as it would be had the recording or playback occurred in an anechoic chamber. The processor thus functions in the manner of a finite impulse response filter which is generally known in the field of digital electronics.

Figure 6:
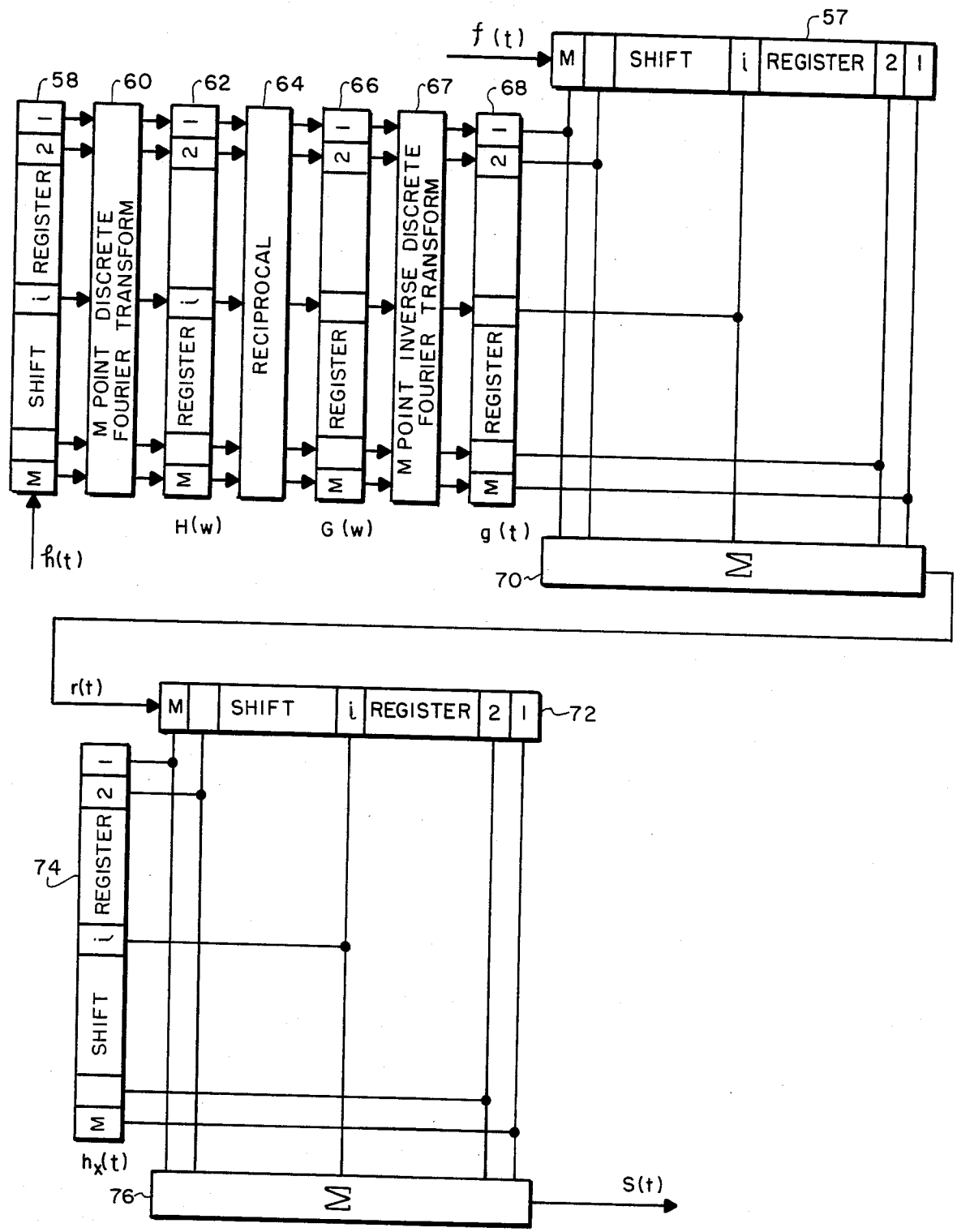
FIG. 6 is a block diagram of an alternative embodiment of the present invention using a running convolution processor.

FIG. 6 illustrates an alternative form of processor for operating on a running stream of the values of the input signal f(t) applied to shift register 57 rather than the batch operation of the multiple Fourier transform convolution processors of FIG. 4. In this embodiment the room response signal values h(t) are applied to shift register 58, transformed at 60 to the frequency domain $H(\omega)$ and stored in register 62. Again the complex reciprocal $G(\omega)$ is calculated at 64 and the results stored in register 66. An M point inverse discrete Fourier transform is then applied at 67 to retransform the values to the time domain g(t). The g(t) values stored in register 68 thus represent the effective inverse or deconvolution function of the room response h(t) and are multiplied by the running stream of the sampled values of the input signal f(t). The summation of all of the multiplied values at 70 produces a stream of corrected output values r(t) again equivalent to the input signal f(t) had it been recorded or played in an anechoic chamber, but delayed by a time $\tau$.

The room distortions in some locations are, in fact, a desirable enhancement of the sound; in others they are not. The difference defies analysis and measurement by ordinary laboratory instrumentation but is well known. The present invention operates to in effect, strip away the effects of one room as well as microphone or speaker characteristics. It is then possible to substitute the echoes and reverberations which are characteristic of a preferred location. To make such a substitution it is not necessary to completely understand what makes a combination of resonances and reverberations "good" or "bad." It is only necessary to record and store the test characteristics of the preferred location, and in the same manner as above generate a second function representing the acoustic room response of the preferred room.

The corrected output r(t) may then be applied to a second shift register 72 and multiplied by the second set of values $h_x(t)$ stored in register 74. Summation of all of the multiplied values at 76 produces a stream of output values S(t) corresponding to the input signal f(t) had it been recorded or played in the desired room. Except for the generation of the time domain room response values g(t) and $h_x(t)$ the remaining operations of the processor of FIG. 6 may be implemented as a transversal filter using analog electronics.

A more simplified alternative to cascading a double convolution with a deconvolution as shown in FIG. 6 is a direct multiplication of the Fourier transforms $H_x(\omega)$ by $G(\omega)$ and storing the product in shift register 66. Thus, registers 72 and 74 and summation circuit 76 may be eliminated. Similarly the product may be stored at shift register 50 of FIG. 6 thus saving many of the elements which would otherwise be required when two processors are cascaded.

From the foregoing discussion it will be understood that the applicants have provided a new and improved method and apparatus for correcting acoustic distortions whereby the objectives set forth hereinabove are efficiently achieved. Since certain changes in the above-described construction and method will occur to those skilled in the art without departure from the scope of the invention, it is intended that all matter set forth in the preceding description or shown in the appended drawings shall be interpreted as illustrative and not in a limiting sense.

Having described what is new and novel and desired to secure by Letters Patent, what is claimed is:

1. A method of correcting acoustic distortion in an audio signal introduced by room environment comprising the steps of
    introducing an acoustic test impulse into said room environment at a first predetermined location therein;
    detecting said acoustic test impulse at a second predetermined location in said room environment to thereby provide a room response signal representing said acoustic test impulse as distorted by the acoustic properties of said room environment;
    calculating the reciprocal of said room response signal to provide a set of equalizing values; and
    applying said equalizing values to said audio signal to thereby provide an equalized audio signal wherein the distortion introduced by said room environment is substantially eliminated.

2. The method of claim 1 further including the steps of:
    introducing an acoustic test impulse into a preferred room environment at a first predetermined location therein;
    detecting said acoustic test impulse at a second predetermined location in said preferred room environment to thereby provide a preferred room response signal representing said acoustic test impulse as modified by the acoustic properties of said preferred room environment;
    calculating a set of modifying values representing the acoustic properties of said preferred room environment; and
    applying said modifying values to said equalized audio signal to thereby provide a modified audio signal wherein the acoustic effects of said preferred room environment are introduced.

3. The method of claim 2 further including
    introducing a plurality of acoustic test impulses into said preferred room environment;
    detecting each of said plurality of acoustic test impulses to provide a plurality of preferred room response signals; and
    averaging said preferred room response signals prior to calculating said modifying values.

4. The method of claim 2 further including the step of
    recording said modified audio signal on an audio recording medium.

5. The method of claim 2 wherein said audio signal is provided by an audio recording playback device and further including the step of
    applying said modified audio signal to a loudspeaker.

6. The method of claim 1 further including
    introducing a plurality of acoustic test impulses into said room environment;
    detecting each of said plurality of acoustic test impulses to provide a plurality of room response signals; and averaging said room response signals prior to said calculating step.

7. The method of claim 1 wherein said calculating step includes the steps of
    sampling said room response signal at a selected rate in amplitude as a function of time;
    storing said sampled room response signal values;
    applying a discrete Fourier transform to each of said stored samples of said room response signal to thereby transform said samples into complex values in the frequency domain;
    storing said complex frequency domain sample values of said room response signal;
    calculating the complex reciprocal values of each of said stored complex frequency domain sample values; and storing said complex reciprocal values of said room response signal.

8. The method of claim 7 further including the steps of
    sampling said audio signal in amplitude as a function of time at the same selected rate as said room response signal is sampled;
    storing said sampled audio signal values;
    applying a discrete Fourier transform to each of said stored samples of said audio signal to thereby transform said samples into complex values in the frequency domain
    storing said complex frequency domain values of said audio signal.

9. The method of claim 8 wherein said applying step includes the steps of
    multiplying each value of said complex frequency domain values of said audio signal by the corresponding complex reciprocal values of said room response signal;
    storing the value of each said multiplication;
    applying an inverse discrete Fourier transform to each stored value of said multiplication to thereby retransform said values to the time domain;
    storing said retransformed values; and releasing said retransformed values from storage in the same sequence as the corresponding sampled audio signals were stored.

10. The method of claim 7 further including the steps of
sampling said audio signal in amplitude as a function of time at the same selected rate as said room response signal is sampled;
storing said sampled audio signal values;
applying an inverse discrete Fourier transform to each complex reciprocal frequency domain sample value of said room response signal to thereby retransform said values to the time domain;
storing said retransformed reciprocal time domain values of said room response signal;
multiplying each sample of said audio signal by each of said stored retransformed reciprocal time domain values of said room response signal;
summing the products of each said multiplication to thereby produce an equalized audio output signal corresponding to said audio signal wherein the distortion introduced by said room environment is substantially eliminated.

11. The method of claim 10 further including
introducing an acoustic test impulse into a preferred room environment at a first predetermined location therein;
detecting said acoustic test impulse at a second predetermined location in said preferred room environment to thereby provide a preferred room response signal.
sampling said preferred room response signal in amplitude as a function of time at the same selected rate as said audio signal is sampled;
storing the value of each sample of said preferred room response signal;
mutliplying each sample of said equalized audio output signal by each of said stored values of said preferred room response signal; and
summing the products of each said multiplication to thereby produce a modified audio output signal corresponding to said audio signal modified by the acoustic properties of said preferred room environment.

12. The method of claim 1 further including the step of
recording said equalized audio signal on an audio recording medium.

* * * * *